United States Patent
Kawachi et al.

(10) Patent No.: US 10,263,757 B2
(45) Date of Patent: Apr. 16, 2019

(54) FILTER CIRCUIT AND MODULE

(71) Applicant: TAIYO YUDEN CO., LTD., Tokyo (JP)

(72) Inventors: Osamu Kawachi, Tokyo (JP); Kensei Uehara, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 645 days.

(21) Appl. No.: 14/447,265

(22) Filed: Jul. 30, 2014

(65) Prior Publication Data

US 2014/0341090 A1 Nov. 20, 2014

Related U.S. Application Data

(63) Continuation of application No. PCT/JP2012/052599, filed on Feb. 6, 2012.

(51) Int. Cl.
*H04B 7/06* (2006.01)
*H04L 5/14* (2006.01)
*H03H 9/72* (2006.01)
*H04B 1/00* (2006.01)
(Continued)

(52) U.S. Cl.
CPC ........... *H04L 5/1461* (2013.01); *H03H 9/725* (2013.01); *H04B 1/0057* (2013.01); *H04B 1/0064* (2013.01); *H04B 7/0617* (2013.01); *H04B 7/0682* (2013.01); *H03H 9/0576* (2013.01); *H04B 7/10* (2013.01)

(58) Field of Classification Search
CPC .... H04B 1/0057; H04B 1/0064; H04B 1/005; H04B 7/0617; H04B 7/0682; H04B 7/10; H04L 5/1461

USPC ........................................................ 370/278
See application file for complete search history.

(56) References Cited

U.S. PATENT DOCUMENTS 5,386,203 A * 1/1995 Ishihara ................... H04B 1/52
333/129
5,815,804 A * 9/1998 Newell ................. H04B 1/005
330/101

(Continued)

FOREIGN PATENT DOCUMENTS

JP 09-98046 A 4/1997
JP 10-247801 A 9/1998
(Continued)

OTHER PUBLICATIONS

International Search Report (ISR) issued in PCT/JP2012/052599 dated Mar. 2012.
(Continued)

*Primary Examiner* — Raj Jain
(74) *Attorney, Agent, or Firm* — Chen Yoshimura LLP

(57) ABSTRACT

A filter circuit includes: a first transmission filter connected between a first antenna terminal and a first transmission terminal; a second transmission filter connected between the first antenna terminal and a second transmission terminal; a first reception filter connected between a second antenna terminal and a first reception terminal, the second antenna terminal being connected to an antenna different from an antenna to which the first antenna terminal is connected; and a second reception filter connected between the second antenna terminal and a second reception terminal.

9 Claims, 12 Drawing Sheets

(51) Int. Cl.
*H03H 9/05* (2006.01)
*H04B 7/10* (2017.01)

(56) References Cited

U.S. PATENT DOCUMENTS

| | | | | |
|---|---|---|---|---|
| 5,926,466 A * | 7/1999 | Ishida | ............... | H01P 1/20345 370/280 |
| 5,933,062 A * | 8/1999 | Kommrusch | ........ | H03H 9/6483 310/313 B |
| 6,130,897 A * | 10/2000 | Ishida | .................... | H04B 1/005 370/276 |
| 6,724,278 B1 * | 4/2004 | Smith | .................... | H04B 1/005 333/101 |
| 7,280,564 B1 * | 10/2007 | Geile | ................. | H03M 13/356 370/507 |
| 2002/0042894 A1 * | 4/2002 | Henriksson | ........... | H04W 24/06 714/25 |
| 2002/0090974 A1 * | 7/2002 | Hagn | .................... | H04B 1/005 455/552.1 |
| 2003/0076194 A1 * | 4/2003 | Machui | .................... | H04B 1/52 333/133 |
| 2005/0104685 A1 * | 5/2005 | Kuroki | ................. | H04B 1/0057 333/133 |
| 2005/0245201 A1 * | 11/2005 | Ella | ....................... | H04B 1/005 455/78 |
| 2006/0094393 A1 * | 5/2006 | Okuyama | ............ | H04B 1/0057 455/333 |
| 2006/0194550 A1 * | 8/2006 | Block | .................... | H04B 1/005 455/78 |
| 2006/0286942 A1 | 12/2006 | Okuyama | | |
| 2008/0024243 A1 * | 1/2008 | Iwaki | .................... | H03H 9/706 333/133 |
| 2008/0212500 A1 * | 9/2008 | Zhen | ....................... | H04B 1/52 370/277 |
| 2008/0285531 A1 | 11/2008 | Okuyama et al. | | |
| 2009/0002097 A1 * | 1/2009 | Takamine | ............ | H03H 9/0057 333/133 |
| 2009/0093270 A1 * | 4/2009 | Block | ...................... | H04B 1/52 455/552.1 |
| 2009/0147707 A1 * | 6/2009 | Koga | ....................... | H01P 1/213 370/282 |
| 2009/0286501 A1 * | 11/2009 | Rousu | .................... | H04B 1/525 455/323 |
| 2010/0022197 A1 * | 1/2010 | Kato | ....................... | H04B 1/005 455/75 |
| 2010/0062727 A1 * | 3/2010 | Kemmochi | ............... | H04B 1/44 455/74 |
| 2010/0118744 A1 * | 5/2010 | Kwon | .................... | H04B 1/406 370/278 |
| 2010/0135192 A1 * | 6/2010 | Kim | ........................ | H01Q 3/30 370/280 |
| 2010/0265852 A1 * | 10/2010 | Tikka | .................... | H04B 1/0057 370/278 |
| 2011/0045786 A1 * | 2/2011 | Leinonen | ................. | H01Q 3/24 455/78 |
| 2011/0128092 A1 * | 6/2011 | Fritz | ...................... | H03H 9/706 333/133 |
| 2011/0248794 A1 * | 10/2011 | Klamm | .................. | H03H 9/725 333/133 |
| 2011/0291899 A1 * | 12/2011 | Cho | ...................... | B29C 45/0055 343/702 |
| 2012/0086524 A1 * | 4/2012 | Komura | ................ | H03H 9/725 333/195 |
| 2012/0098618 A1 * | 4/2012 | Tanaka | ................. | H03H 9/6436 333/133 |
| 2012/0218052 A1 * | 8/2012 | Tsurunari | ........... | H03H 9/02559 333/133 |
| 2012/0243447 A1 * | 9/2012 | Weissman | ............ | H04B 1/0458 370/280 |
| 2013/0137475 A1 * | 5/2013 | Rousu | .................. | H04W 72/0453 455/509 |
| 2014/0341090 A1 * | 11/2014 | Kawachi | ................ | H03H 9/725 370/278 |
| 2016/0043858 A1 * | 2/2016 | Lee | ....................... | H03F 1/0261 370/278 |

FOREIGN PATENT DOCUMENTS

| | | |
|---|---|---|
| JP | 2001-189678 A | 7/2001 |
| JP | 2006-352532 A | 12/2006 |
| JP | 2008-193739 A | 8/2008 |
| JP | 2010-56876 A | 3/2010 |
| JP | 2011-254451 A | 12/2011 |

OTHER PUBLICATIONS

Written Opinion (PCT/ISA/237) issued in PCT/JP2012/052599 dated Mar. 2012.
English translation of Written Opinion (PCT/ISA/237) issued in PCT/JP2012/052599 dated Mar. 2012.
Japanese Office Action dated Aug. 18, 2015, in a counterpart Japanese patent application No. 2013-557264.

* cited by examiner

FILTER CIRCUIT AND MODULE

CROSS-REFERENCE TO RELATED APPLICATION

This application is a continuation application of PCT/JP2012/052599 filed Feb. 6, 2012, the contents of which are herein wholly incorporated by reference.

FIELD

The present invention relates to a filter circuit and a module, e.g. to a filter circuit and a module which have a plurality of filters.

BACKGROUND

For example, in a mobile communication terminal, a plurality of band pass filters are used in response to various communication methods. For example, there are a FDD (Frequency Division Duplex) method and a TDD (Time Division Duplex) method as a communication method that transmits a transmission signal to a single antenna and receives a reception signal from the single antenna.

For example, in the FDD method, a transmission band differs from a reception band, as described in Japanese Laid-open Patent Publication No. 09-98046 ("Patent Document 1"). Therefore, a demultiplexer equipped with a transmission filter that sets the transmission band as a pass band and a reception filter that sets the reception band as a pass band is used. In this demultiplexer, a transmission signal is transmitted from an antenna via the transmission filter, but does not pass the reception filter. On the contrary, a reception signal which the antenna receives passes the reception filter, but does not pass the transmission filter. Thereby, the transmission of the transmission signal and the reception of the reception signal are enabled with the single antenna.

For example, in the TDD method, the transmission band and the reception band overlap with each other, as described in Japanese Laid-open Patent Publication No. 2010-56876 ("Patent Document2"). Therefore, a period in which the transmission signal is transmitted and a period in which the reception signal is received are divided by switching a switch or the like. Thereby, the transmission of the transmission signal and the reception of the reception signal are enabled with a single antenna. A technique in which a plurality of antennas are provided in a mobile communication terminal is described in Japanese Laid-open Patent Publication No. 2011-254451 ("Patent Document 3").

It is demanded to perform simultaneously the transmission and reception of different communication methods. For example, it is demanded to perform simultaneously the transmission and reception using the FDD method and the transmission and reception using the TDD method. By performing simultaneously the transmission and reception of the different communication methods, data communication and voice communication can be achieved simultaneously by using the different communication methods.

SUMMARY OF THE INVENTION

According to an aspect of the present invention, there is provided a filter circuit including: a first transmission filter connected between a first antenna terminal and a first transmission terminal; a second transmission filter connected between the first antenna terminal and a second transmission terminal; a first reception filter connected between a second antenna terminal and a first reception terminal, the second antenna terminal being connected to an antenna different from an antenna to which the first antenna terminal is connected; and a second reception filter connected between the second antenna terminal and a second reception terminal.

According to another aspect of the present invention, there is provided a module including the above filter circuit.

DETAILED DESCRIPTION

Figure 1:
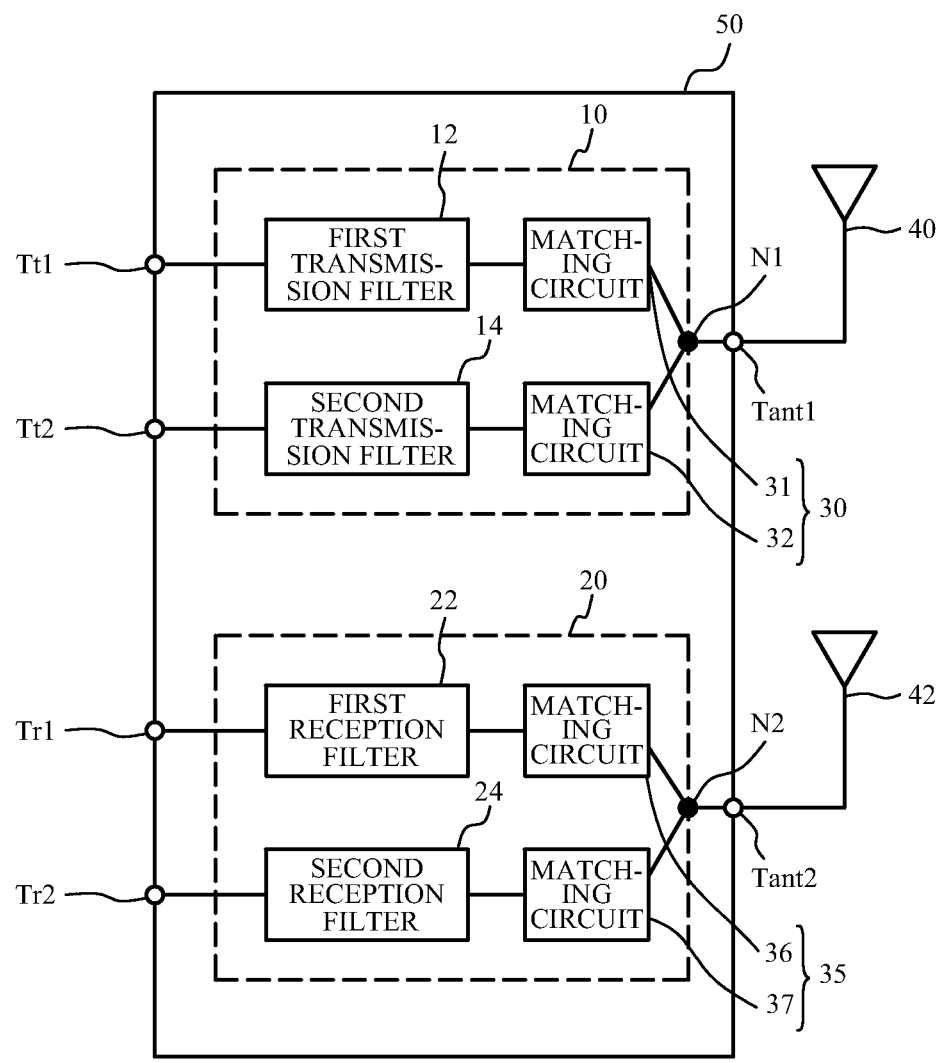
FIG. 1 is a block diagram of a filter circuit according to a first embodiment.

Hereinafter, a description will be given of embodiments of the present invention with reference to drawings.
First Embodiment
FIG. 1 is a block diagram of a filter circuit according to a first embodiment. As illustrated in FIG. 1, a filter circuit 50 includes a transmission filter circuit 10 and a reception filter circuit 20. The transmission filter circuit 10 includes a first transmission filter 12, a second transmission filter 14, and a first matching circuit 30. The first matching circuit 30 includes matching circuits 31 and 32. The reception filter circuit 20 includes a first reception filter 22, a second reception filter 24, and a second matching circuit 35. The second matching circuit 35 includes matching circuits 36 and 37.

The first transmission filter 12 is electrically connected between a first antenna terminal Tant1 and a first transmission terminal Tt1. The second transmission filter 14 is electrically connected between the first antenna terminal Tant1 and a second transmission terminal Tt2. The matching circuit 31 is electrically connected between the first transmission filter 12 and the first antenna terminal Tant1. The matching circuit 32 is electrically connected between the second transmission filter 14 and the first antenna terminal Tant1. The matching circuits 31 and 32 are connected to a node N1 in common. The first antenna terminal Tant1 is electrically connected to an antenna 40.

The first reception filter 22 is electrically connected between a second antenna terminal Tant2 and a first reception terminal Tr1. The second reception filter 24 is electrically connected between the second antenna terminal Tant2 and a second reception terminal Tr2. The matching circuit 36 is electrically connected between the first reception filter 22 and the second antenna terminal Tant2. The matching circuit 37 is electrically connected between the second reception filter 24 and the second antenna terminal Tant2. The matching circuits 36 and 37 are connected to a node N2 in common. The second antenna terminal Tant2 is electrically connected to an antenna 42 different from the antenna 40 to which the first antenna terminal Tant1 is electrically connected. As the antennas 40 and 42, a flexible antenna as described in Patent Document 3 is used, for example. Thereby, it becomes easy to arrange a plurality of antennas within the mobile communication terminal.

Figure 2:
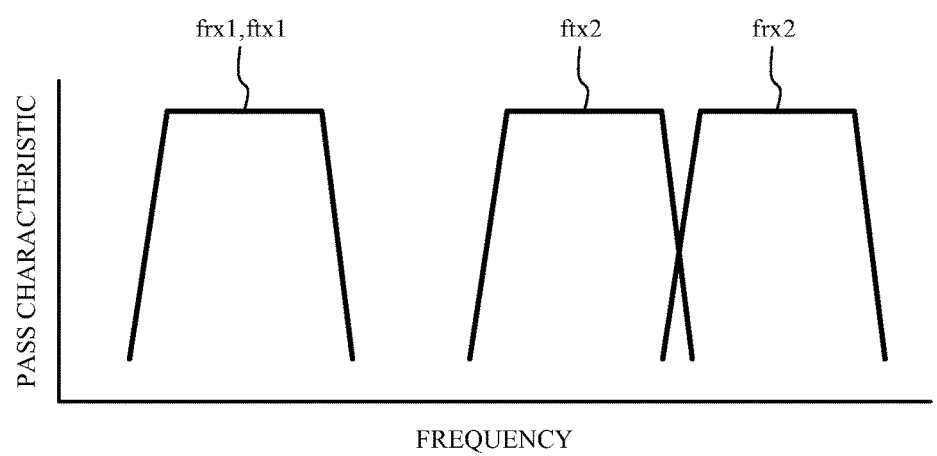
FIG. 2 is a pass characteristic of each filter.

FIG. 2 is a pass characteristic of each filter. A pass characteristic ftx1 of the first transmission filter 12 and a pass characteristic frx1 of the first reception filter 22 are approximately the same as each other. The first transmission filter 12 and the first reception filter 22 have pass bands so that at least parts of the pass bands overlap with each other. For example, the pass bands are identical with each other. The pass bands of the first transmission filter 12 and the first reception filter 22 include a transmission band and a reception band in a band 40 of a LTE (Long Term Evolution), respectively, for example. The transmission band and the reception band in the band 40 of the LTE are from 2300 MHz to 2400 MHz. A communication method of the band 40 of the LTE is the TDD method.

A pass characteristic ftx2 of the second transmission filter 14 and a pass characteristic frx2 of the second reception filter 24 are different from each other. The pass bands of the second transmission filter 14 and the second reception filter 24 include the transmission band and the reception band of a band 7 of the LTE, respectively, for example. The transmission band of the band 7 of the LTE is from 2500 MHz to 2570 MHz. The reception band of the band 7 of the LTE is from 2620 MHz to 2690 MHz. A communication method of the band 7 of the LTE is the FDD method.

Figure 3A:
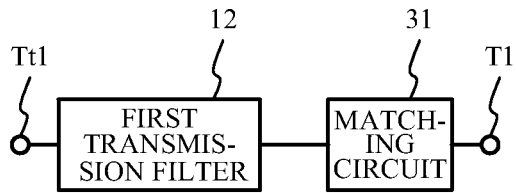
FIG. 3A is a block diagram of a first transmission filter and a matching circuit.
Figure 3B:
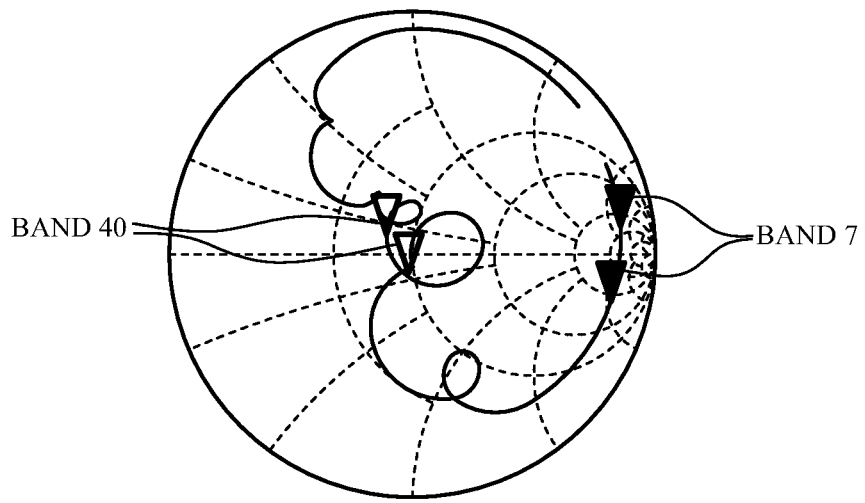
FIG. 3B is a Smith chart.
Figure 3C:
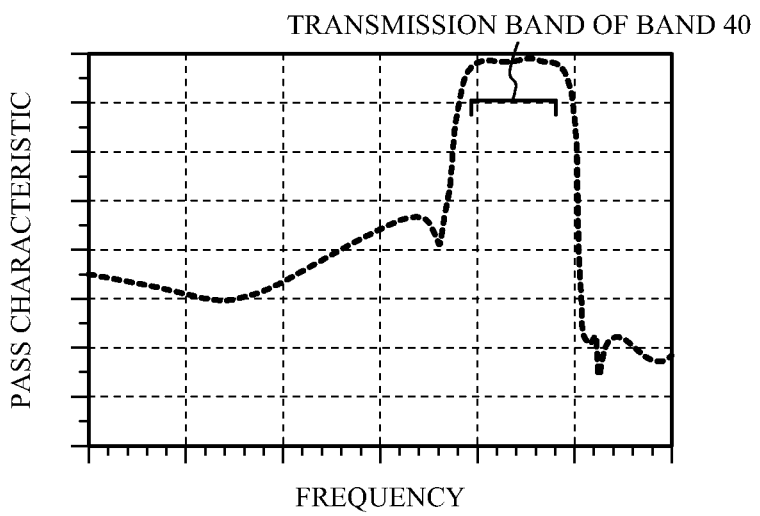
FIG. 3C is a diagram illustrating a pass characteristic.

Hereinafter, a description will be given of a function of the matching circuit 30 with reference to FIGS. 3A to 5C. FIG. 3A is a block diagram of the first transmission filter and the matching circuit, FIG. 3B is a Smith chart, and FIG. 3C is a diagram illustrating the pass characteristic. As illustrated in FIG. 3A, the first transmission filter 12 and the matching circuit 31 are connected in series between the first transmission terminal Tt1 and a terminal T1. FIG. 3B is the Smith chart of an impedance in the case where the first transmission filter 12 is seen from the terminal T1. A gap between white triangles indicates the transmission band of the band 40, and a gap between black triangles indicates the transmission band of the band 7. In the transmission band of the band 40, the impedance seen from the terminal T1 becomes about 50Ω, as illustrated in FIG. 3B. In the transmission band of the band 7, the impedance seen from the terminal T1 approaches infinity. A signal in the pass band of the first transmission filter 12 passes between the first transmission terminal Tt1 and the terminal T1, and a signal outside the pass band is suppressed, as illustrated in FIG. 3C.

Figure 4A:
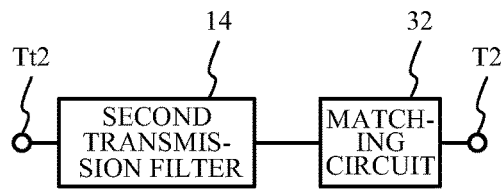
FIG. 4A is a block diagram of a second transmission filter and a matching circuit.
Figure 4B:
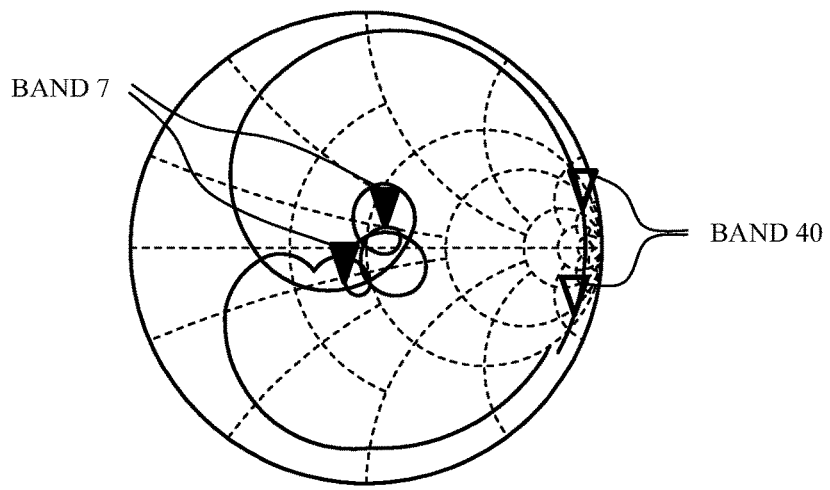
FIG. 4B is a Smith chart.
Figure 4C:
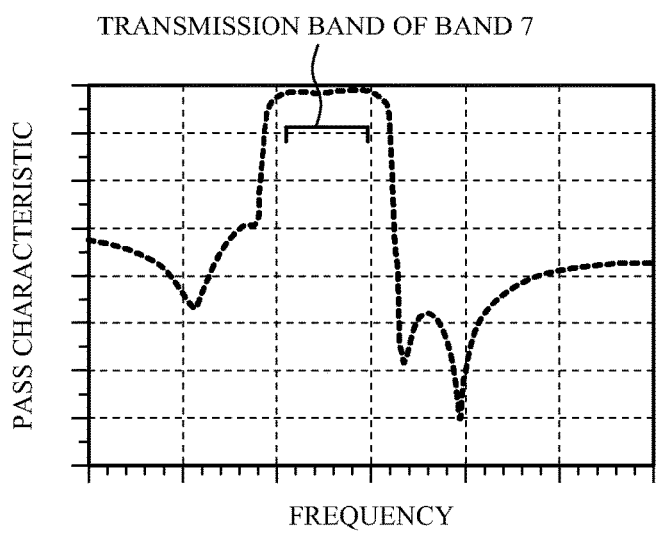
FIG. 4C is a diagram illustrating a pass characteristic.

FIG. 4A is a block diagram of the second transmission filter and the matching circuit. FIG. 4B is a Smith chart. FIG. 4C is a diagram illustrating a pass characteristic. As illustrated in FIG. 4A, the second transmission filter 14 and the matching circuit 32 are connected in series between the second transmission terminal Tt2 and a terminal T2. FIG. 4B is the Smith chart of an impedance in the case where the second transmission filter 14 is seen from the terminal T2. A gap between white triangles indicates the transmission band of the band 40, and a gap between black triangles indicates the transmission band of the band 7. In the transmission band of the band 7, the impedance seen from the terminal T2 becomes about 50Ω, as illustrated in FIG. 4B. In the transmission band of the band 40, the impedance seen from the terminal T2 approaches infinity. A signal in the pass band of the second transmission filter 14 passes between the second transmission terminal Tt2 and the terminal T2, and a signal outside the pass band is suppressed, as illustrated in FIG. 4C.

Figure 5A:
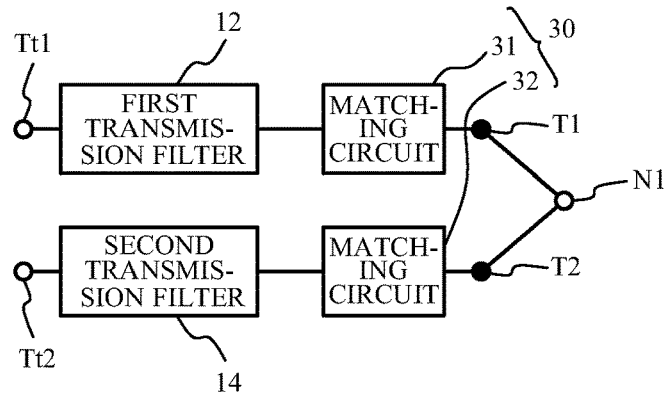
FIG. 5A is a block diagram of the first transmission filter, the second transmission filter and the matching circuits.
Figure 5B:
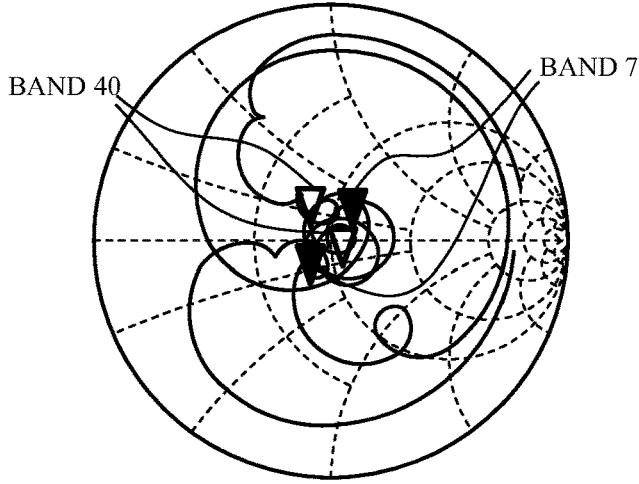
FIG. 5B is a Smith chart.
Figure 5C:
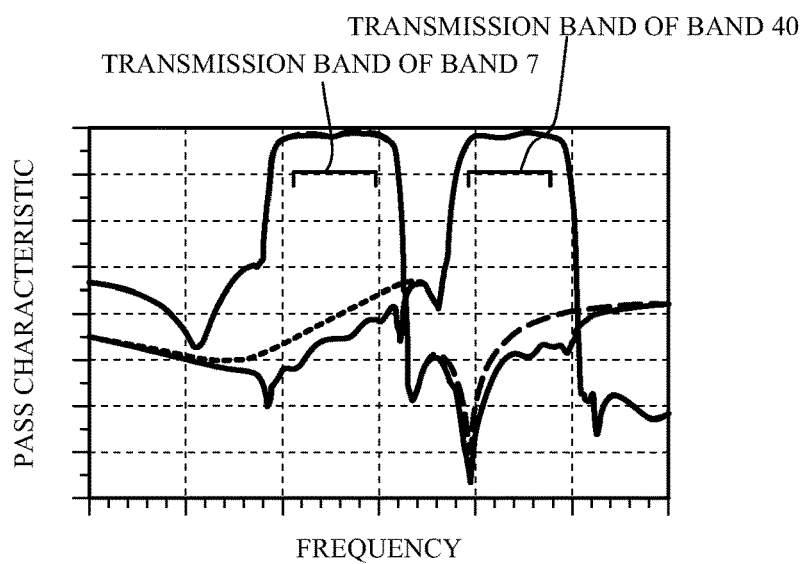
FIG. 5C is a diagram illustrating a pass characteristic.

FIG. 5A is a block diagram of the first transmission filter, the second transmission filter and the matching circuits. FIG. 5B is a Smith chart. FIG. 5C is a diagram illustrating a pass characteristic. As illustrated in FIG. 5A, the terminals T1 and T2 are connected to the node N1 in common. FIG. 5B is a Smith chart of an impedance in the case where the first transmission filter 12 and the second transmission filter 14 are seen from the node N1. A gap between white triangles indicates the transmission band of the band 40, and a gap between black triangles indicates the transmission band of the band 7. In the transmission bands of the bands 40 and 7, each of the impedances seen from the node N1 becomes about 50Ω, as illustrated in FIG. 5B. With reference to FIG. 5C, a solid line illustrates the pass characteristic from the first transmission terminal Tt1 to the node N1 and the pass characteristic from the second transmission terminal Tt2 to the node N2. A dotted line illustrates the pass characteristic of FIG. 3C, and a dashed line illustrates the pass characteristic of FIG. 4C.

In the matching circuit 30, the impedances seen from the node N1 are set so as to pass the signal in the pass band of the first transmission filter 12 and the signal in the pass band of the second transmission filter 14, as illustrated in FIG. 5B. That is, the impedances of the first transmission filter 12 and the second transmission filter 14 match an impedance of the antenna 40. Thereby, as illustrated in FIG. 5C, a transmission signal of the band 40 inputted from the first transmission terminal Tt1 is outputted from the node N1, and a transmission signal of the band 7 inputted from the second transmission terminal Tt2 is outputted from the node N1.

On the contrary, in the matching circuit 30, the impedance seen from the terminal T1 is set so that the signal in the pass band of the first transmission filter 12 does not pass the second transmission filter 14 as illustrated in FIG. 3B, and the impedance seen from the terminal T2 is set so that the signal in the pass band of the second transmission filter 14 does not pass the first transmission filter 12 as illustrated in FIG. 4B. Thereby, the signal which has passed the first transmission filter 12 is outputted from the node N1 without being inputted to the second transmission filter 14 as illustrated in FIG. 3C, and similarly the signal which has passed the second transmission filter 14 is outputted from the node N1 without being inputted to the first transmission filter 12 as illustrated in FIG. 4C. Here, the first matching circuit 30 should just be connected between the first antenna terminal Tant1 and at least one of the first transmission filter 12 and the second transmission filter 14.

Thus, the transmission signal of the band 40 and the transmission signal of the band 7 can be outputted from the first antenna 40 simultaneously.

The matching circuit 35 is also the same as this. That is, in the matching circuit 35, impedances seen from the node N2 are set so as to pass the signal in the pass band of the first reception filter 22 and the signal in the pass band of the second reception filter 24. Moreover, the impedances are set so that the signal in the pass band of the first reception filter 22 does not pass the second reception filter 24 and the signal in the pass band of the second reception filter 24 does not pass the first reception filter 22. Thereby, a reception signal of the band 40 inputted from the second antenna terminal Tant2 passes the first reception filter 22 and is outputted to the first reception terminal Tr1, but is not inputted to the second reception filter 24. A reception signal of the band 7 inputted from the second antenna terminal Tant2 passes the second reception filter 24 and is outputted to the second reception terminal Tr2, but is not inputted to the first reception filter 22. Here, the second matching circuit 35 should just be connected between the second antenna terminal Tant2 and at least one of the first reception filter 22 and the second reception filter 24.

Thus, the reception signal of the band 40 and the reception signal of the band 7 can be received from the second antenna 42 simultaneously.

As described above, according to the first embodiment, the plurality of antenna terminals Tant1 and Tant2 connected to the plurality of antennas 40 and 42, respectively, are provided. The first antenna 40 performs only the transmission in the plurality of communication methods, and the second antenna 42 performs only the reception in the plurality of communication methods. Thereby, the transmission and the reception in the plurality of different communication methods can be performed simultaneously.

The communication band of the first transmission filter 12 and the communication band of the first reception filter 22 may differ from each other. Even when the communication band of the first transmission filter 12 and the communication band of the first reception filter 22 overlap with each other, the transmission and the reception in the different communication methods can be performed simultaneously.

The communication band of the second transmission filter 14 and the communication band of the second reception 24 filter may overlap with each other, or may differ from each other as described in the first embodiment.

As described in the first embodiment, the communication band of the first transmission filter 12 and the communication band of the first reception filter 22 can include the transmission band and the reception band in which the communication method is the TDD method, respectively. Thereby, the transmission and the reception in the communication method which is the TDD method can be performed simultaneously. Moreover, the communication band of the second transmission filter 14 and the communication band of the second reception filter 24 can include the transmission band and the reception band in which the communication method is the FDD method, respectively. Thereby, the transmission in the different communication methods which is the TDD method and the FDD method can be performed simultaneously. Moreover, the reception can be performed simultaneously. Therefore, the voice communication and the data communication can be performed simultaneously by using the different communication methods, for example. The communication methods which perform the transmission or the reception simultaneously may be the TDD methods or the FDD methods.

Although in the first embodiment, an example of the two antennas and the two communication methods is explained, there may be three or more antennas and three or more communication methods.

Figure 6:
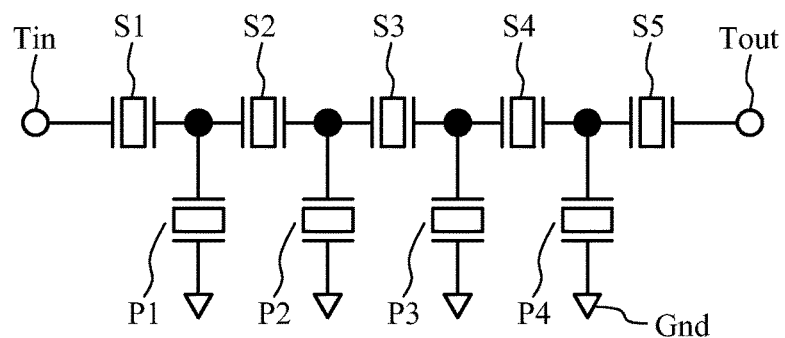
FIG. 6 is a circuit diagram of a ladder type filter.

Next, a description will be given of an example of the first transmission filter 12, the second transmission filter 14, the first reception filter 22 and the second reception filter 24. FIG. 6 is a circuit diagram of a ladder type filter. Serial resonators S1 to S5 are connected in series between an input terminal Tin and an output terminal Tout. Parallel resonators P1 to P4 are connected in parallel between the input terminal Tin and the output terminal Tout. A number of stages of the series resonators and the parallel resonators can be selected suitably. At least one of the first transmission filter 12, the second transmission filter 14, the first reception filter 22 and the second reception filter 24 can include the ladder type filter. Since it is desirable that the transmission filter is a filter having high electric power resistance, for example, the transmission filter can use the ladder type filter.

Figure 7A:
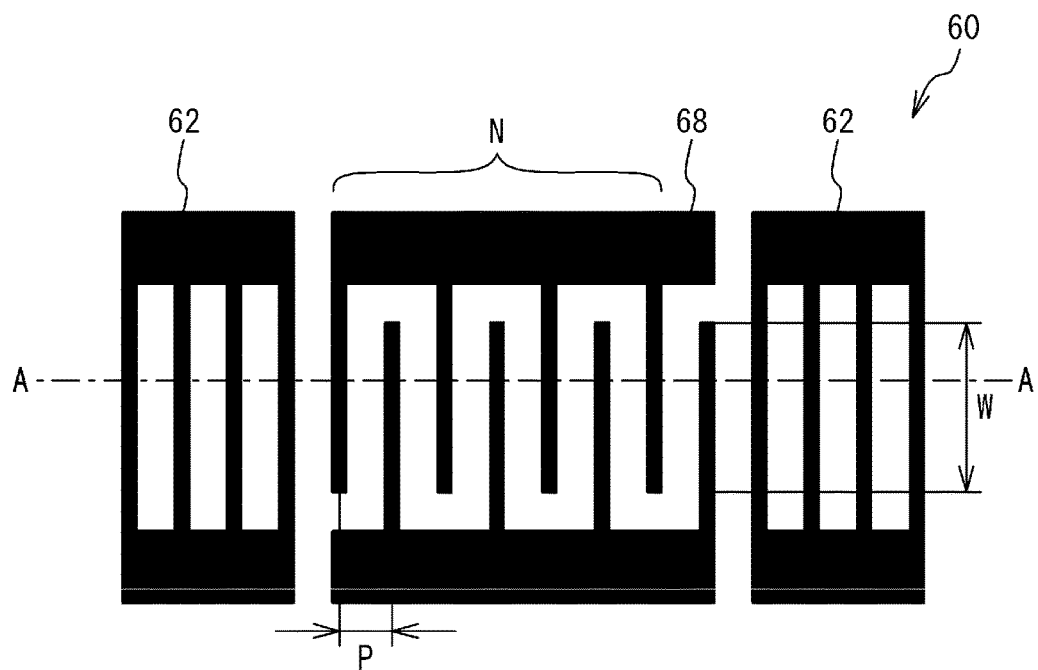
FIG. 7A is a plan view of a surface acoustic wave resonator.
Figure 7B:
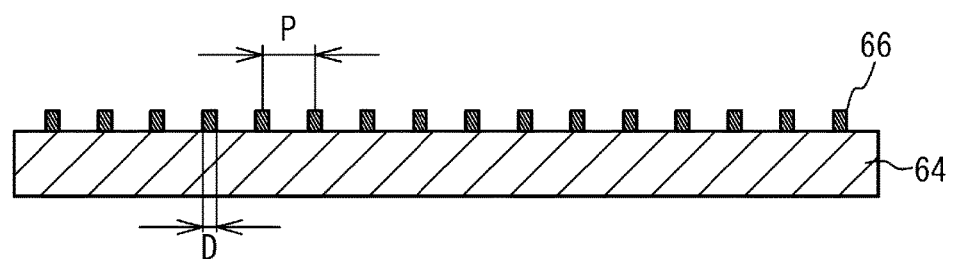
FIG. 7B is a cross-sectional view taken along a line A-A in FIG. 7A.

Next, a description will be given of an example of a resonator. FIG. 7A is a plan view of a surface acoustic wave resonator. FIG. 7B is a cross-sectional view taken along a line A-A in FIG. 7A. As illustrated in FIG. 7A, a resonator 60 includes an IDT (Interdigital Transducer) 68 and reflectors 62 provided in the both sides of the IDT 68. An acoustic wave excited by the IDT 68 is reflected by the reflectors 62. Thereby, the resonator 60 resonates in a resonance frequency. As illustrated in FIG. 7B, metal layers 66 which mainly include Al or Cu are formed on a piezoelectric substrate 64, such as a lithium tantalite substrate or a lithium niobate substrate. The IDT 68 and the reflectors 62 are formed from the metal layers 66. A resonance characteristic of the resonator 60 is mainly decided by a pitch P between electrode fingers of the IDT 68, a number of pairs of electrode fingers, an opening length W and a line width D of an electrode finger. The ladder type filter of FIG. 6 can be formed with the resonator 60. Although FIGS. 7A and 7B are example of the surface acoustic wave resonator, a love wave resonator or a boundary acoustic wave resonator can also be used for the ladder type filter of FIG. 6.

Figure 8A:
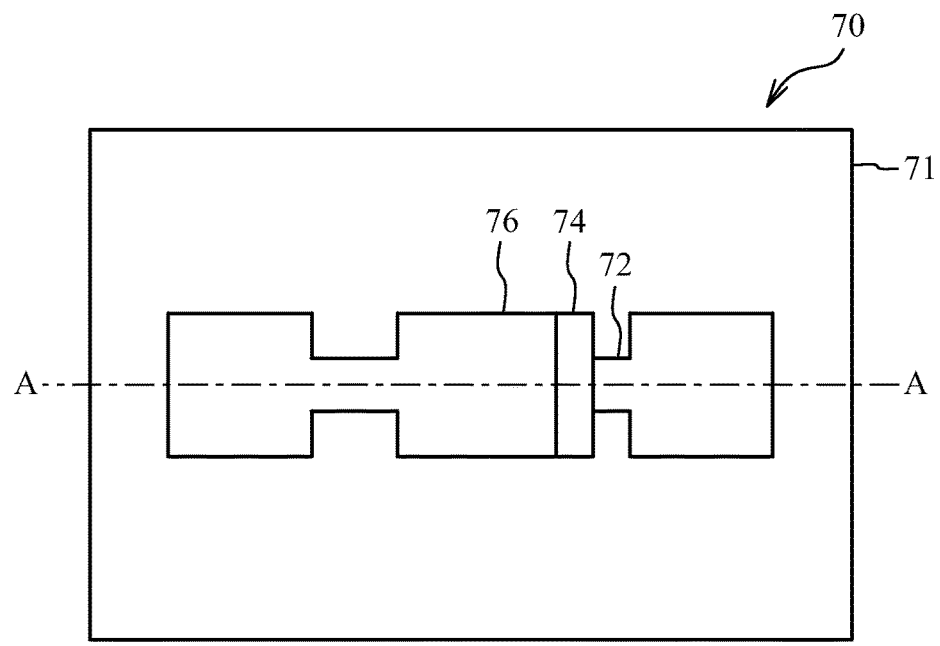
FIG. 8A is a plan view illustrating a piezoelectric thin film resonator.
Figure 8B:
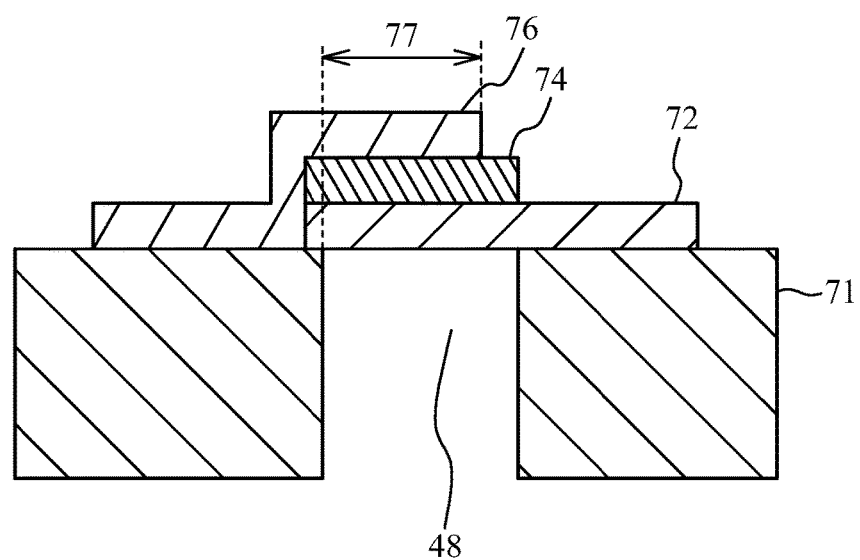
FIG. 8B is a cross-sectional view taken along a line A-A in FIG. 8A.

Next, a description will be given of another example of the resonator. FIG. 8A is a plan view illustrating a piezoelectric thin film resonator, and FIG. 8B is a cross-sectional view taken along a line A-A in FIG. 8A. In a resonator 70, a lower electrode 72, a piezoelectric film 74 such as aluminum nitride, and an upper electrode 76 are sequentially laminated on a substrate 71 such as silicon, as illustrated in FIGS. 8A and 8B. A domain where the upper electrode 76 and the lower electrode 72 sandwich the piezoelectric film 74 and overlap with each other is a resonance domain 77. In the resonance domain 77, an acoustic wave which spreads in up-and-down direction resonates, and the resonance domain 77 functions as a resonator. A cavity 78 is formed in the substrate 71 under the resonance domain 77. The cavity 78 may be formed between the substrate 71 and the lower electrode 72. Moreover, instead of the cavity 78, an acoustic multilayer film which reflects the acoustic wave may be formed. The ladder type filter of FIG. 6 can be formed with the resonator 70.

Figure 9:
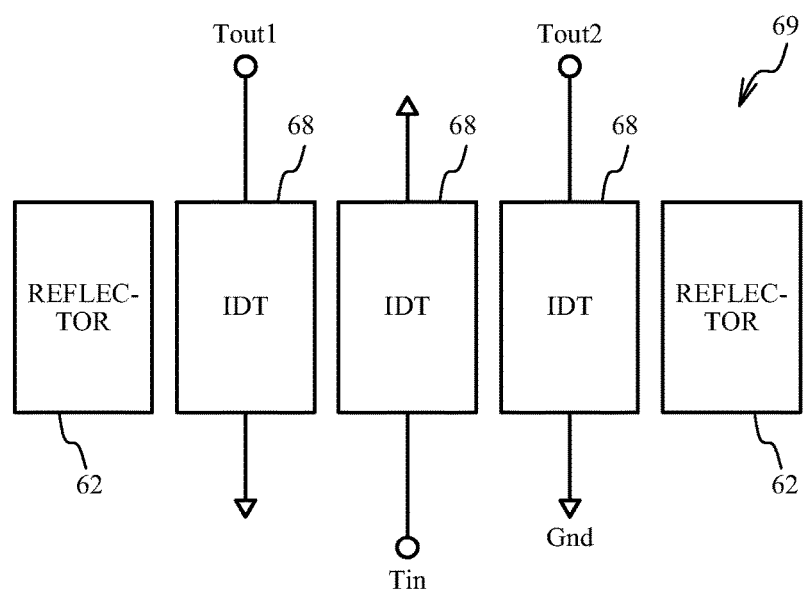
FIG. 9 is a block diagram a multi-mode type filter.

FIG. 9 is a block diagram a multi-mode type filter. In a multi-mode type filter 69, three IDTs 68 are arranged between the reflectors 62, as illustrated in FIG. 9. A central IDT 68 is electrically connected between a ground and the input terminal Tin. The IDTs 68 of the both sides are connected between the ground and the output terminals Tout 1 and Tout2. Although the output terminals Tout1 and Tout2 may be imbalance terminals, the output terminals Tout1 and Tout2 can be set as balance terminals. Thus, the plurality of IDTs are arranged in a propagation direction of the acoustic wave, so that a longitudinal coupled duplex mode filter to be obtained by acoustic coupling can be achieved. At least one of the first transmission filter 12, the second transmission filter 14, the first reception filter 22 and the second reception filter 24 can include the multi-mode type filter.

Second Embodiment

Figure 10:
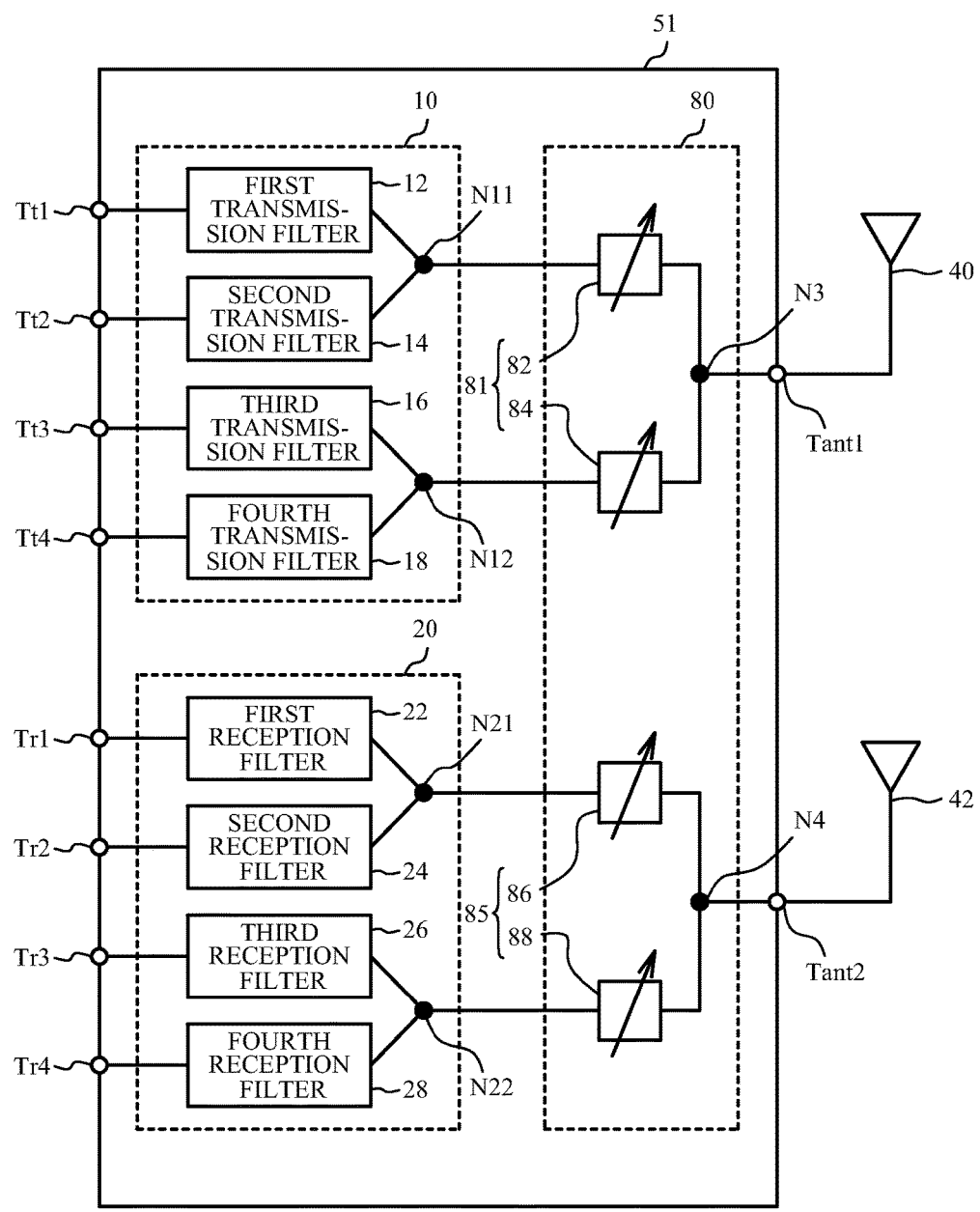
FIG. 10 is a block diagram of a filter circuit according to a second embodiment.

A second embodiment is an example in which the filter circuit includes a variable matching circuit. FIG. 10 is a block diagram of the filter circuit according to the second embodiment. As illustrated in FIG. 10, a filter circuit 51 includes a transmission filter circuit 10, a reception filter circuit 20 and a variable matching circuit 80. The transmission filter circuit 10 includes first to fourth transmission filters 12 to 18. The reception filter circuit 20 includes first to fourth transmission filters 22 to 28. The variable matching circuit 80 includes a first variable matching circuit 81 and a second variable matching circuit 85. The first variable matching circuit 81 and the second variable matching circuit 85 include variable matching circuits 82 and 84, and variable matching circuit 86 and 88, respectively.

The first transmission filter 12 is electrically connected between the first transmission terminal Tt1 and a node N11 (a first common node). The second transmission filter 14 is electrically connected between the second transmission terminal Tt2 and the node N11. Thus, the node N11 is connected in common to the first transmission filter 12 and the second transmission filter 14 in the direction of the first antenna terminal Tant1. The third transmission filter 16 is electrically connected between a third transmission terminal Tt3 and a node N12 (a second common node). The fourth transmission filter 18 is electrically connected between a fourth transmission terminal Tt4 and the node N12.

The first reception filter 22 is electrically connected between the first reception terminal Tr1 and a node N21 (a third common node). The second reception filter 24 is electrically connected between the second reception terminal Tr2 and a node N21. Thus, the node N21 is connected in common to the first reception filter 22 and the second reception filter 24 in the direction of the second antenna terminal Tant2. A third reception filter 26 is electrically connected between a third reception terminal Tr3 and a node N22 (a fourth common node). A fourth reception filter 28 is electrically connected between a fourth reception terminal Tr4 and the node N22.

The variable matching circuit 82 is electrically connected between the nodes N11 and N3. The variable matching circuit 84 is electrically connected between the nodes N12 and N3. The variable matching circuit 86 is electrically connected between the nodes N21 and N4. The variable matching circuit 88 is electrically connected between the nodes N22 and N4. Each of the variable matching circuits 82, 84, 86 and 88 include a variable inductor or/and a variable capacitor. An impedance is changeable by changing an inductance or/and a capacitance. For the change of the impedance, a MEMS (Micro Electro Mechanical System) switch or a semiconductor switch can be used. The nodes N3 and N4 are electrically connected to the antenna terminals Tant1 and Tant2, respectively.

In the first transmission filter 12 and the first reception filter 22, the pass bands are set so as to include the transmission band (2300 MHz to 2400 MHz) and the reception band (2300 MHz to 2400 MHz) of the band 40 of the LTE, respectively, for example. In the second transmission filter 14 and the second reception filter 24, the pass bands are set so as to include the transmission band (880 MHz to 915 MHz) and the reception band (925 MHz to 960 MHz) of a band 8 of WCDMA, respectively, for example. In the third transmission filter 16 and the third reception filter 26, the pass bands are set so as to include the transmission band (1850 MHz to 1910 MHz) and the reception band (1930 MHz to 1990 MHz) of a band 2 of the WCDMA, respectively, for example. In the fourth transmission filter 18 and the fourth reception filter 28, the pass bands are set so as to include the transmission band (824 MHz to 849 MHz) and the reception band (869 MHz to 894 MHz) of a band 5 of the WCDMA, respectively, for example.

A signal in the pass band of the first transmission filter 12 among signals inputted from the first transmission terminal Tt1 is outputted from the node N11 and is not inputted to the second transmission filter 14. A signal in the pass band of the second transmission filter 14 among signals inputted from the second transmission terminal Tt2 is outputted from the node N11 and is not inputted to the first transmission filter 12. Thus, a matching circuit may be provided between the node N11 and at least one of the first transmission filter 12 and the second transmission filter 14.

A signal in the pass band of the third transmission filter 16 among signals inputted from the third transmission terminal Tt3 is outputted from the node N12 and is not inputted to the fourth transmission filter 18. A signal in the pass band of the fourth transmission filter 18 among signals inputted from the fourth transmission terminal Tt4 is outputted from the node N12 and is not inputted to the third transmission filter 16. Thus, a matching circuit may be provided between the node N12 and at least one of the third transmission filter 16 and the fourth transmission filter 18.

When a transmission signal of the band 40 is inputted to the first transmission terminal Tt1 and a transmission signal of the band 2 is inputted to the third transmission terminal Tt3, for example, the impedances of the variable matching circuits 82 and 84 in the first variable matching circuit 81 are changed so that the transmission signal of the band 2 is outputted to the first antenna terminal Tant1 and is not outputted to the node N11, and the transmission signal of the band 40 is outputted to the first antenna terminal Tant1 and is not outputted to the node N12. That is, the variable matching circuit 82 matches the impedance of the antenna 40 to the impedance of the node N11 in the transmission band of the band 40, and increases the impedance in the transmission band of the band 2. The variable matching circuit 84 matches the impedance of the antenna 40 to the impedance of the node N12 in the transmission band of the band 2, and increases the impedance in the transmission band of the band 40.

Thus, by changing the impedances, the first variable matching circuit 81 allows the signal in the pass band of any one of the first transmission filter 12 and the second transmission filter 14 to pass from the node N11 to the first antenna terminal Tant1, and does not allow the signals in the pass bands of the third transmission filter 16 and the fourth transmission filter 18 to pass from the node N12 to the node N11. By changing the impedances, the first variable matching circuit 81 allows the signal in the pass band of any one of the third transmission filter 16 and the fourth transmission filter 18 to pass from the node N12 to the first antenna terminal Tant1, and does not allow the signals in the pass bands of the first transmission filter 12 and the second transmission filter 14 to pass from the node N11 to the node N12.

Thereby, the signal in the pass band of any one of the first transmission filter 12 and the second transmission filter 14 and the signal in the pass band of any one of the third transmission filter 16 and the fourth transmission filter 18 can be outputted from the first antenna terminal Tant1 simultaneously. For example, the transmission signal of any one of the band 40 and the band 8 is selected. Moreover, the transmission signal of any one of the band 2 and the band 5 is selected. The two selected transmission signals can be outputted from the first antenna terminal Tant1 simultaneously.

The signal in the pass band of the first reception filter 22 among the signals inputted from the node N21 is outputted from the first reception terminal Tr1 and is not inputted to the second reception filter 24. The signal in the pass band of the second reception filter 24 among the signals inputted from the node N21 is outputted from the second reception terminal Tr2 and is not inputted to the first reception filter 22. Thus, a matching circuit may be provided between the node N21 and at least one of the first reception filter 22 and the second reception filter 24.

The signal in the pass band of the third reception filter 26 among the signals inputted from the node N22 is outputted from the third reception terminal Tr3 and is not inputted to the fourth reception filter 28. The signal in the pass band of the fourth reception filter 28 among the signals inputted from the node N22 is outputted from the fourth reception terminal Tr4 and is not inputted to the third reception filter 26. Thus, a matching circuit may be provided between the node N22 and at least one of the third reception filter 26 and the fourth reception filter 28.

For example, the impedances of the variable matching circuits 86 and 88 in the second variable matching circuit 85 are changed so that the reception signal of the band 40 among signals which the second antenna 42 receives is outputted to the node N21 and is not outputted to the node N22, and the reception signal of the band 2 among signals which the second antenna 42 receives is outputted to the node N22 and is not outputted to the node N21. Thereby, the reception signal of the band 40 is outputted to the first reception terminal Tr1, and the reception signal of the band 2 is outputted to the third reception terminal Tr3.

Thus, by changing the impedances, the second variable matching circuit 85 allows the signal in the pass band of any one of the first reception filter 22 and the second reception filter 24 to pass from the second antenna terminal Tant2 to the node N21, and does not allow the signals in the pass bands of the third reception filter 26 and the fourth reception filter 28 to pass from the second antenna terminal Tant2 to the node N22. By changing the impedances, the second variable matching circuit 85 allows the signal in the pass band of any one of the third reception filter 26 and the fourth reception filter 28 to pass from the second antenna terminal Tant2 to the node N22, and does not allow the signals in the pass bands of the first reception filter 22 and the second reception filter 24 to pass from the second antenna terminal Tant2 to the node N21.

Thereby, the signal in the pass band of any one of the first reception filter 22 and the second reception filter 24 and the signal in the pass band of any one of the third reception filter 26 and the fourth reception filter 28 can be outputted from the reception terminal simultaneously. For example, the reception signal of any one of the band 40 and the band 8 is selected. Moreover, the reception signal of any one of the band 2 and the band 5 is selected. The two selected reception signals can be outputted from the reception terminal simultaneously.

Although the second embodiment is an example in which the transmission and the reception of four communication methods are performed with the two antennas, the transmission and the reception of five or more communication methods can also be performed with the two antennas by increasing the number of variable matching circuits and filters to be connected in parallel to each antenna.

Third Embodiment

Figure 11:
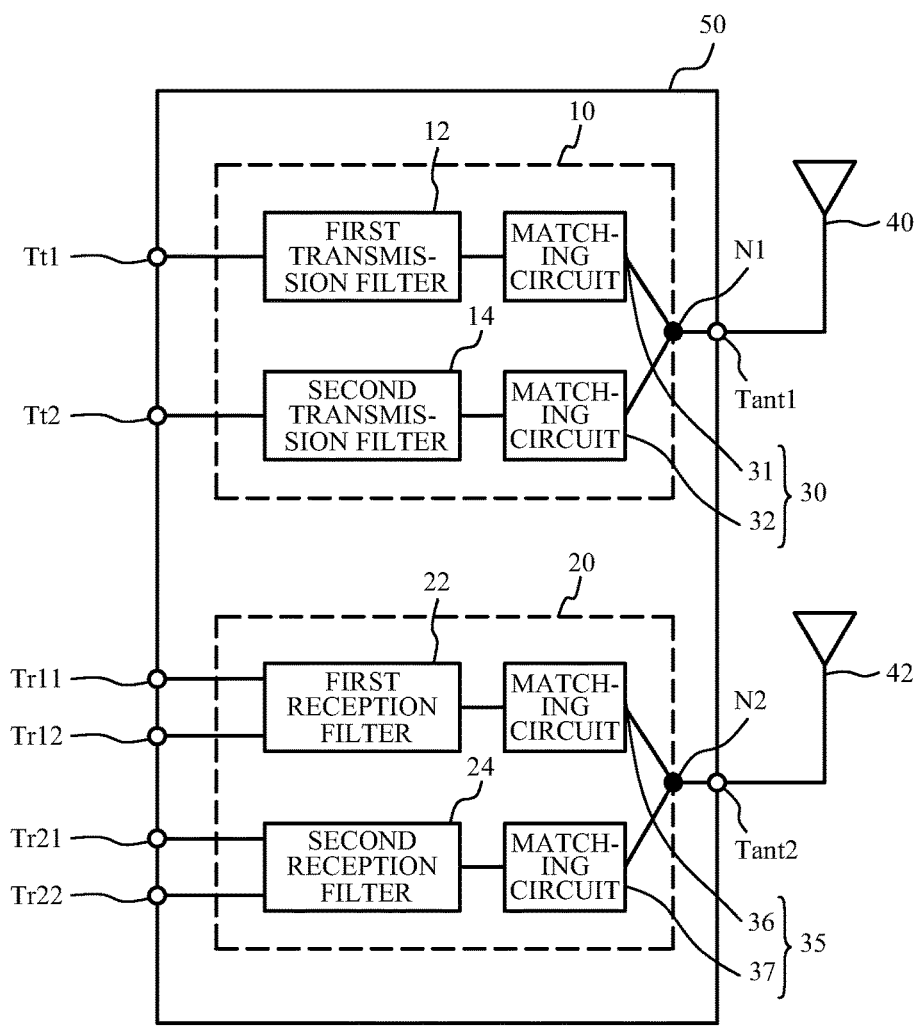
FIG. 11 is a block diagram of a filter circuit according to a third embodiment.

A third embodiment is an example in which at least one of the transmission terminal and the reception terminal is a balance terminal. FIG. 11 is a block diagram of a filter circuit according to the third embodiment. As illustrated in FIG. 11, the first reception terminals Tr11 and Tr12 and the second reception terminals Tr21 and Tr22 are balance terminals. Other elements are the same as those in FIG. 1 of the first embodiment, and a description thereof is omitted. As illustrated in the third embodiment, at least one of the first transmission terminal, the second transmission terminal, the first reception terminal and the second reception terminal may be the balance terminal. Moreover, in the second embodiment, at least one of the transmission terminal and the reception terminal may be the balance terminal.

Fourth Embodiment

Figure 12:
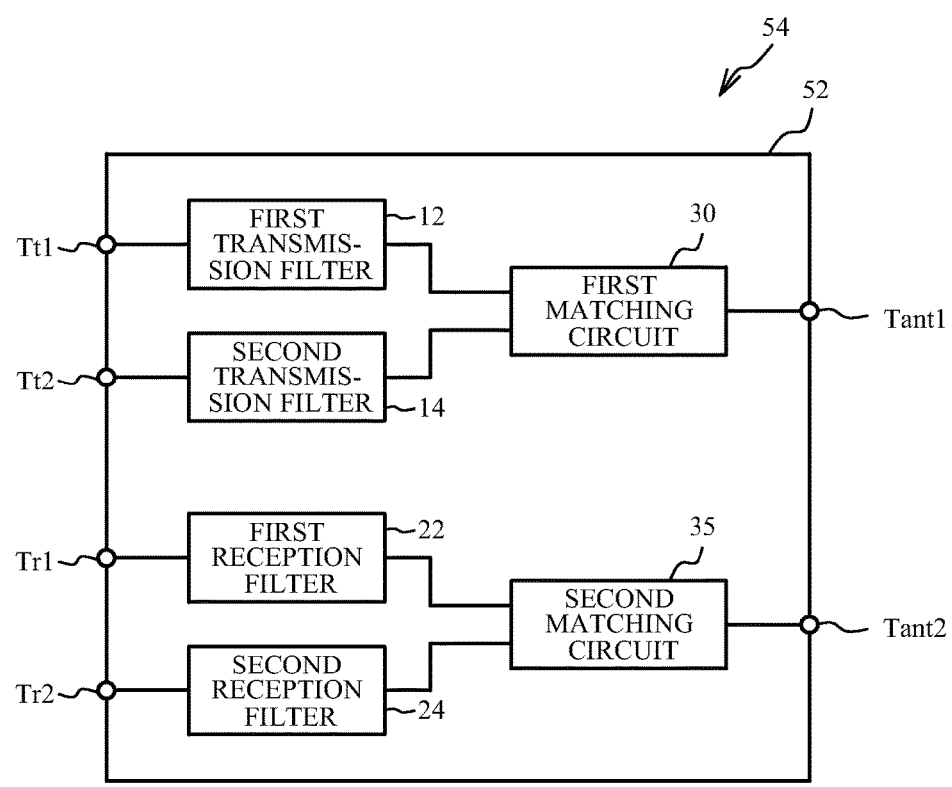
FIG. 12 is a schematic diagram of a module according to a fourth embodiment.

A fourth embodiment is an example of a module. FIG. 12 is a schematic diagram of the module according to the fourth embodiment. A module 54 includes a substrate 52. In the substrate 52, an insulation layer and a conductive layer are laminated, for example. The first transmission filter 12, the second transmission filter 14, the first reception filter 22, the second reception filter 24, the first matching circuit 30 and the second matching circuit 35 are mounted on the substrate 52. These filters and these matching circuits may be mounted on the substrate 52, or may be mounted by being embedded in the substrate 52. Other elements are the same as those of the first embodiment, and a description thereof is omitted. Thus, the module including the filter circuits according to one of the first to third embodiments can be formed.

Although the embodiments of the present invention have been described in detail, it should be understood that the present invention is not limited to these specific embodiments, and the various change, substitutions, and alterations could be made hereto without departing from the spirit and scope of the invention.

What is claimed is:

1. A filter circuit comprising:
a first transmission filter connected between a first antenna terminal and a first transmission terminal, the first antenna terminal being connected to a first antenna;
a second transmission filter connected between the first antenna terminal and a second transmission terminal;
a first reception filter connected between a second antenna terminal and a first reception terminal, the second antenna terminal being connected to a second antenna different from the first antenna; and
a second reception filter connected between the second antenna terminal and a second reception terminal,
wherein:
a pass band of the first transmission filter and a pass band of the first reception filter include a transmission band and a reception band of a first band, respectively, in which a communication method is a TDD method, the transmission band and the reception band of the first band overlapping with each other;
a pass band of the second transmission filter and a pass band of the second reception filter include a transmission band and a reception band of a second band, respectively, in which a communication method is a FDD method, the transmission band and the reception band of the second band being different from each other;

a transmission signal of the first band that passes the first transmission filter and a transmission signal of the second band that passes the second transmission filter are transmitted from the first antenna terminal simultaneously, and/or a reception signal of the first band that passes the first reception filter and a reception signal of the second band that passes the second reception filter are received from the second antenna terminal simultaneously; and the first antenna terminal is not connected to a second antenna, the second antenna terminal is not connected to the first antenna, the first antenna transmits the transmission signals of the first band and the second band and does not receive the reception signals of the first band and the second band, and the second antenna receives the reception signals of the first band and the second band and does not transmit the transmission signals of the first band and the second band.

2. The filter circuit according to claim 1, comprising:
a first matching circuit having an impedance so that a signal in the pass band of the first transmission filter fails to pass the second transmission filter and a signal in the pass band of the second transmission filter fails to pass the first transmission filter;
a second matching circuit having an impedance so that a signal in the pass band of the first reception filter fails to pass the second reception filter and a signal in the pass band of the second reception filter fails to pass the first reception filter.

3. The filter circuit according to claim 1, wherein
at least one of the first transmission terminal, the second transmission terminal, the first reception terminal, and the second reception terminal is a balance terminal.

4. The filter circuit according to claim 1, further comprising:
a third transmission filter connected between the first antenna terminal and a third transmission terminal;
a fourth transmission filter connected between the first antenna terminal and a fourth transmission terminal;
a first common node connected in common to the first transmission filter and the second transmission filter in the direction of the first antenna terminal;
a second common node connected in common to the third transmission filter and the fourth transmission filter in the direction of the first antenna terminal; and
a first variable matching circuit that is connected between the first common node and the first antenna terminal and between the second common node and the first antenna terminal, and is capable of changing an impedance.

5. The filter circuit according to claim 4,
wherein the first variable matching circuit, by changing the impedance, allows a first signal in a pass band of any one of the first transmission filter and the second transmission filter to pass from the first common node to the first antenna terminal, fails to allow a signal in pass bands of the third transmission filter and the fourth transmission filter to pass from the second common node to the first common node, allows a second signal in a pass band of any one of the third transmission filter and the fourth transmission filter to pass from the second common node to the first antenna terminal, and fails to allow a signal in pass bands of the first transmission filter and the second transmission filter to pass from the first common node to the second common node, when the first signal that passes said any one of the first transmission filter and the second transmission filter and the second signal that passes said any one of the third transmission filter and the fourth transmission are transmitted from the first antenna terminal simultaneously.

6. The filter circuit according to claim 1, further comprising:
a third reception filter connected between the second antenna terminal and a third reception terminal;
a fourth reception filter connected between the second antenna terminal and a fourth reception terminal;
a third common node connected in common to the first reception filter and the second reception filter in the direction of the second antenna terminal;
a fourth common node connected in common to the third reception filter and the fourth reception filter in the direction of the second antenna terminal; and
a second variable matching circuit that is connected between the third common node and the second antenna terminal and between the fourth common node and the second antenna terminal, and is capable of changing an impedance.

7. The filter circuit according to claim 6,
wherein the second variable matching circuit, by changing the impedance, allows a first signal in a pass band of any one of the first reception filter and the second reception filter to pass from the second antenna terminal to the third common node, fails to allow a signal in pass bands of the third reception filter and the fourth reception filter to pass from the second antenna terminal to the fourth common node, allows a second signal in a pass band of any one of the third reception filter and the fourth reception filter to pass from the second antenna terminal to the fourth common node, and fails to allow a signal in pass bands of the first reception filter and the second reception filter to pass from the second antenna terminal to the third common node, when the first signal that passes said any one of the first reception filter and the second reception filter and the second signal that passes said any one of the third reception filter and the fourth reception filter are received from the second antenna terminal simultaneously.

8. The filter circuit according to claim 1, wherein
the pass band of the first transmission filter and the pass band of the second transmission filter do not overlap, and the pass band of the first reception filter and the pass band of the second reception filter do not overlap.

9. The filter circuit according to claim 1,
wherein the pass band of the first transmission filter is fixed, the pass band of the second transmission filter is fixed, the pass band of the first reception filter is fixed, and the pass band of the second reception filter is fixed.

* * * * *